United States Patent
Chiu

(10) Patent No.: US 10,636,811 B1
(45) Date of Patent: Apr. 28, 2020

(54) SEMICONDUCTOR STRUCTURE AND METHOD FOR MANUFACTURING THE SAME

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/179,236

(22) Filed: Nov. 2, 2018

(51) Int. Cl.
  *H01L 27/11582* (2017.01)
  *H01L 21/768* (2006.01)
  *H01L 27/11565* (2017.01)
  *H01L 27/1157* (2017.01)

(52) U.S. Cl.
  CPC .. *H01L 27/11582* (2013.01); *H01L 21/76876* (2013.01); *H01L 27/1157* (2013.01); *H01L 27/11565* (2013.01)

(58) Field of Classification Search
  CPC ......... H01L 27/11582; H01L 27/11565; H01L 27/1157; H01L 21/76876
  USPC ........................................................ 257/324
  See application file for complete search history.

(56) References Cited

U.S. PATENT DOCUMENTS

2014/0151784 A1* 6/2014 Kwak ............... H01L 27/11582
  257/329

* cited by examiner

*Primary Examiner* — Tu-Tu V Ho
(74) *Attorney, Agent, or Firm* — Muncy, Geissler, Olds & Lowe, P.C.

(57) ABSTRACT

The present disclosure provides a semiconductor structure. The semiconductor structure includes a substrate, a plurality of stacks, and a plurality of cell pillars. The stacks include a plurality of sub-stacks, and the stacks are disposed on the substrate and separated from each other by at least one slit. Each of the plurality of sub-stacks has an insulating layer, a first seed layer, and a metal layer being sequentially stacked. The cell pillars penetrate through each of the plurality of stacks.

7 Claims, 15 Drawing Sheets

SEMICONDUCTOR STRUCTURE AND METHOD FOR MANUFACTURING THE SAME

TECHNICAL FIELD

The present disclosure relates to a semiconductor structure and a method for manufacturing the same, and more particularly, to a NAND string and a method for manufacturing the same.

DISCUSSION OF THE BACKGROUND

Many types of semiconductor memory have been developed. Some memory types are volatile and lose their contents when power supply is removed. Some memory types are non-volatile and retain the information stored in the memory even after power supply has been removed. For this reason, the non-volatile memory has been widely used in memory cards and other applications. One type of non-volatile memory is flash memory, which stores charge in a charge storage region of a memory cell.

The flash memory device may be classified into two types. One of the types is a NAND type flash memory device and the other type is an OR type flash memory device.

In the field of NAND flash memories, as a result of the rapid advance in reduction of device size for the purpose of cost savings through enhancement of bit density, cell size has nearly reached a physical limit. Therefore, a stacked nonvolatile memory formed by three-dimensionally stacking memory cells is attracting attention as a means of attaining higher bit density.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate, a plurality of stacks, and a plurality of cell pillars. The stacks are disposed on the substrate and are separated from each other by at least one slit. Each of the plurality of stacks includes a plurality of sub-stacks, and each of the plurality of sub-stacks has an insulating layer, a first seed layer, and a metal layer being sequentially stacked. The cell pillars penetrate through each of the plurality of stacks.

In some embodiments, the cell pillars are spaced apart from the slit.

In some embodiments, each of the plurality of stacks further comprises a plurality of second seed layers disposed on sidewalls of the insulating layers and covered by the metal layers.

In some embodiments, the second seed layers are connected to the first seed layers disposed on the same insulating layers.

In some embodiments, a thickness of the first seed layer is substantially the same as a thickness of the second seed layer.

In some embodiments, a material of the first seed layer and a material of the second seed layer are consistent.

In some embodiments, the cell pillars are connected to the substrate.

In some embodiments, the stacks are separated by a plurality of slits having a substantially uniform width, wherein the slits are parallel to one another.

Another aspect of the present disclosure provides a method for manufacturing a semiconductor structure. The method includes steps of depositing an initial stack comprising a plurality of initial sub-stacks on a substrate, wherein each of the plurality of initial sub-stacks has an insulating layer, a sacrificial layer, and a seed layer sandwiched between the insulating layer and the sacrificial layer; forming a plurality of cell pillars penetrating through the initial stack; forming at least one slit in the initial stack to divide the initial stack into a plurality of portions; removing the sacrificial layers from the slits to form a plurality of lateral recess regions; and depositing a conductive material in the lateral recess regions.

In some embodiments, the insulating layers and the first seed layers in the initial stack are held in place by the cell pillars after removal of the sacrificial layers.

In some embodiments, the method further includes a step of depositing a plurality of second seed layers at least on sidewalls of the insulating layers after removal of the sacrificial layers.

In some embodiments, the conductive material is further deposited on the second seed layers.

In some embodiments, a selective removal of the sacrificial layers is accomplished by a wet etching process.

In some embodiments, the insulating layers, the first seed layers, and the sacrificial layers are formed by an in-situ process.

In some embodiments, the forming of the plurality of cell pillars penetrating through the initial stack includes steps of forming a plurality of openings through the initial stack to expose a major surface of the substrate; and depositing a semiconductor material into the openings.

In some embodiments, a planarization process is performed to remove excess portions of the semiconductor material from above a top surface of the initial stack.

In some embodiments, the first seed layers are exposed to the lateral recess regions.

In some embodiments, the conductive material is deposited on the first seed layers by an electrodepositing process.

With the above-mentioned configurations of a semiconductor structure, the first seed layer disposed on the insulating layer and exposed to the lateral recess regions after removal of the sacrificial layers is used as the electrodepositing electrode for providing a transverse current path needed in the electrodepositing process. Hence, the electrodepositing current can be directed to positions where the first seed layers exist, which results in an effective lateral deposition of the metal layers.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1A:
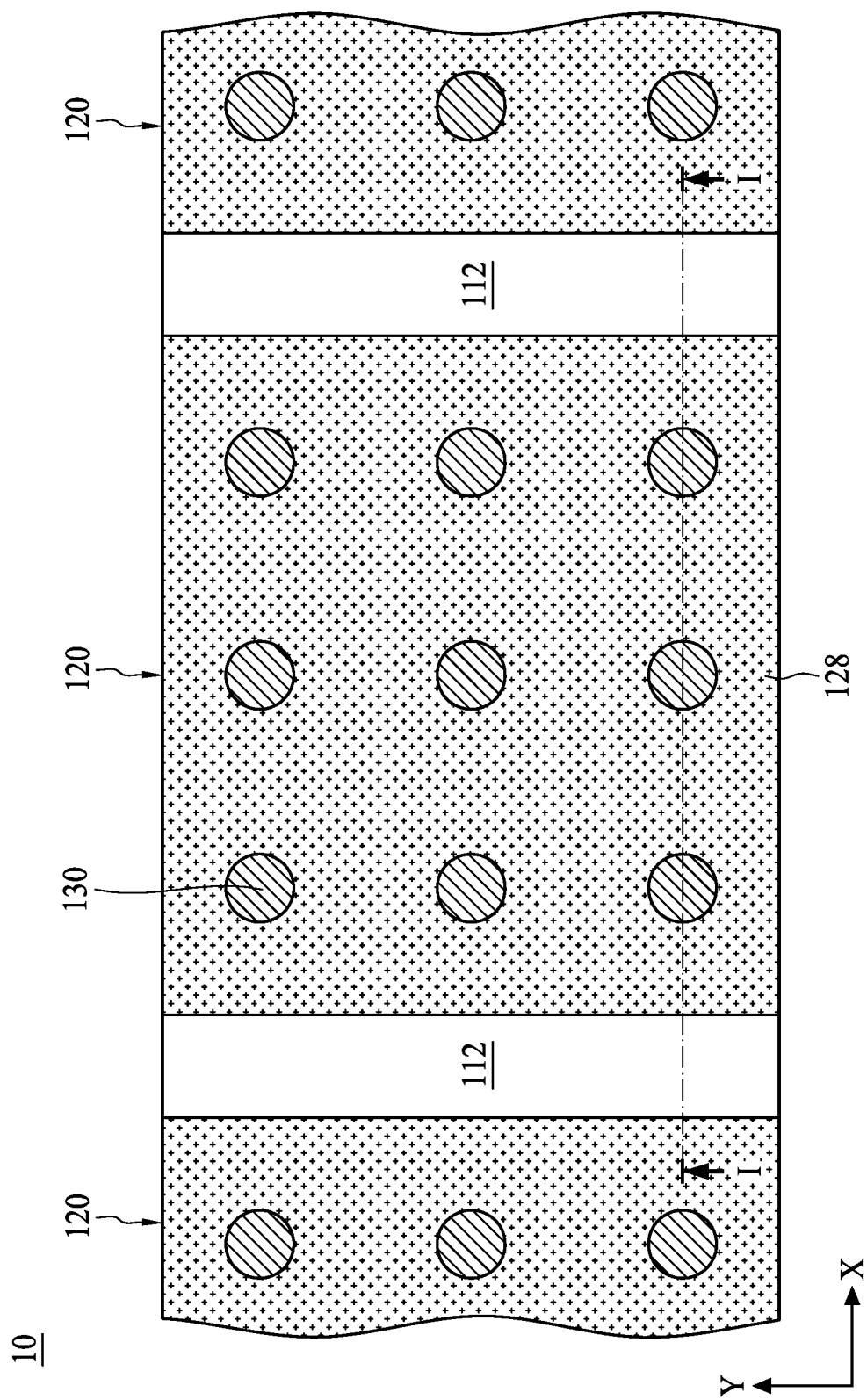
FIG. 1A is a top view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
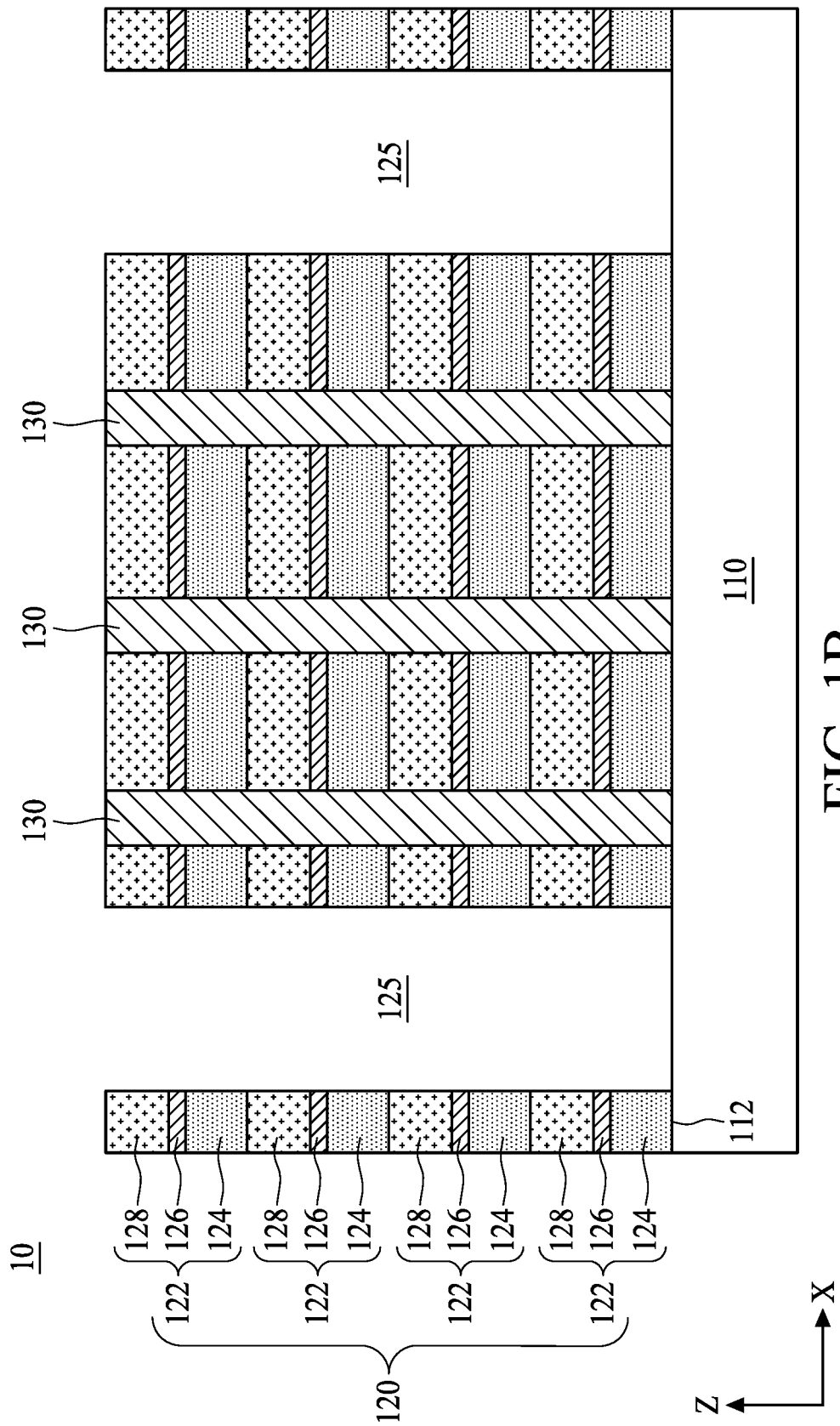
FIG. 1B is a cross-sectional view taken along the line I-I illustrated in FIG. 1A.

FIG. 1A is a top view of a semiconductor structure 10 in accordance with some embodiments of the present disclosure. FIG. 1B is a cross-sectional view taken along the line I-I illustrated in FIG. 1A. Referring to FIGS. 1A and 1B, in some embodiments, the semiconductor structure 10 includes a substrate 110, a plurality of stacks 120 disposed on a major surface 112 of the substrate 110 and separated from each other by a plurality of slits 125, and a plurality of cell pillars 130 penetrating through the stacks 120.

In some embodiments, each of the stacks 120 includes a plurality of sub-stacks 122, and each of the sub-stacks 122 has three layers, including an insulating layer 124, a first seed layer 126, and a metal layer 128. In some embodiments, the first seed layer 126 is sandwiched between the insulating layer 124 and the metal layer 128. In some embodiments, the cell pillars 130 are connected to the substrate 110. In some embodiments, the insulating layers 124 include silicon dioxide. In some embodiments, the first seed layers 126 include titanium, copper, tungsten, or a combination thereof. In some embodiments, the metal layers 128 include copper or tungsten. In some embodiments, the semiconductor structure 10 is a part of a three-dimensional NAND memory.

Figure 2:
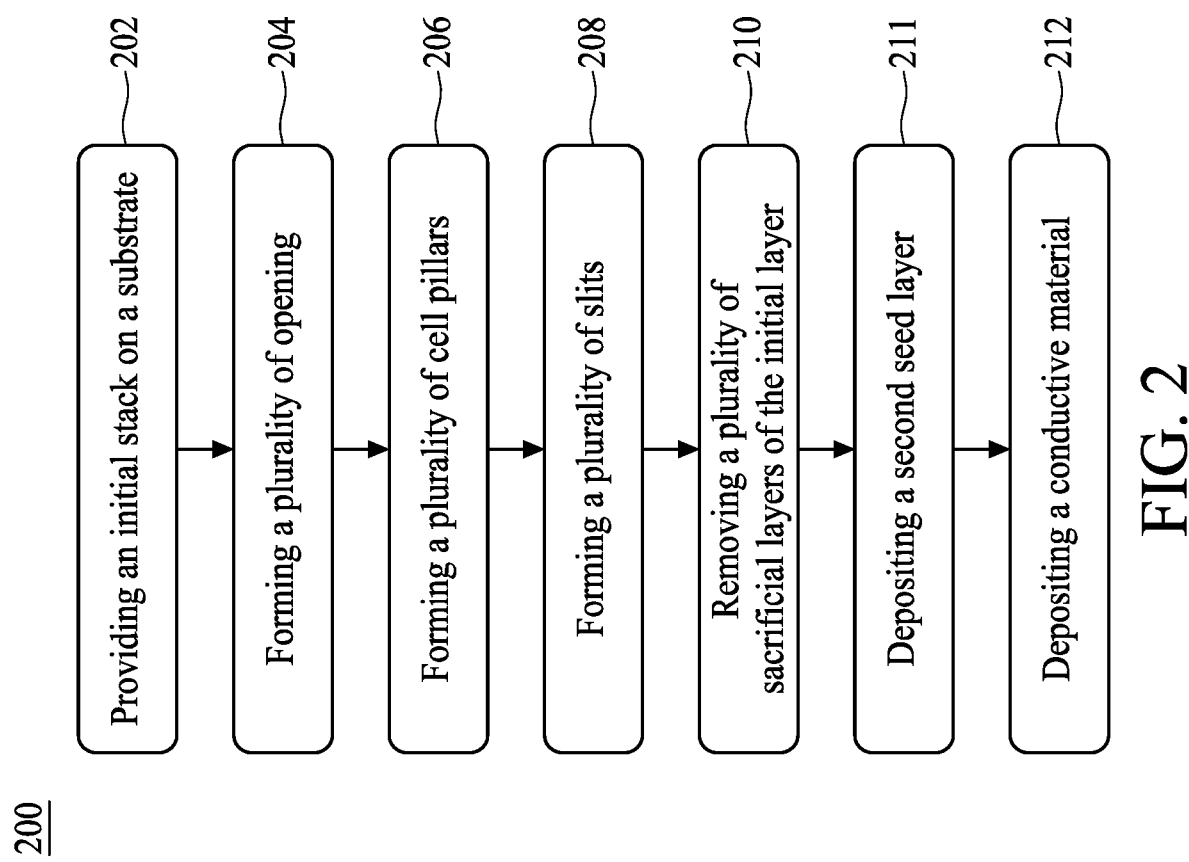
FIG. 2 is a flow diagram illustrating a method for manufacturing a semiconductor structure in accordance with some embodiments of the present disclosure.

FIG. 2 is a flow diagram illustrating a method 200 for manufacturing a semiconductor structure 10, in accordance with some embodiments of the present disclosure. FIGS. 3 to 10 are schematic diagrams illustrating various fabrication stages constructed according to the method for manufacturing the semiconductor structure 10 in accordance with some embodiments of the present disclosure. The stages shown in FIGS. 3 to 10 are also illustrated schematically in the process flow shown in FIG. 2. In the subsequent discussion, the fabrication stages shown in FIGS. 3 to 10 are discussed in reference to the process steps in FIG. 2.

Figure 3:
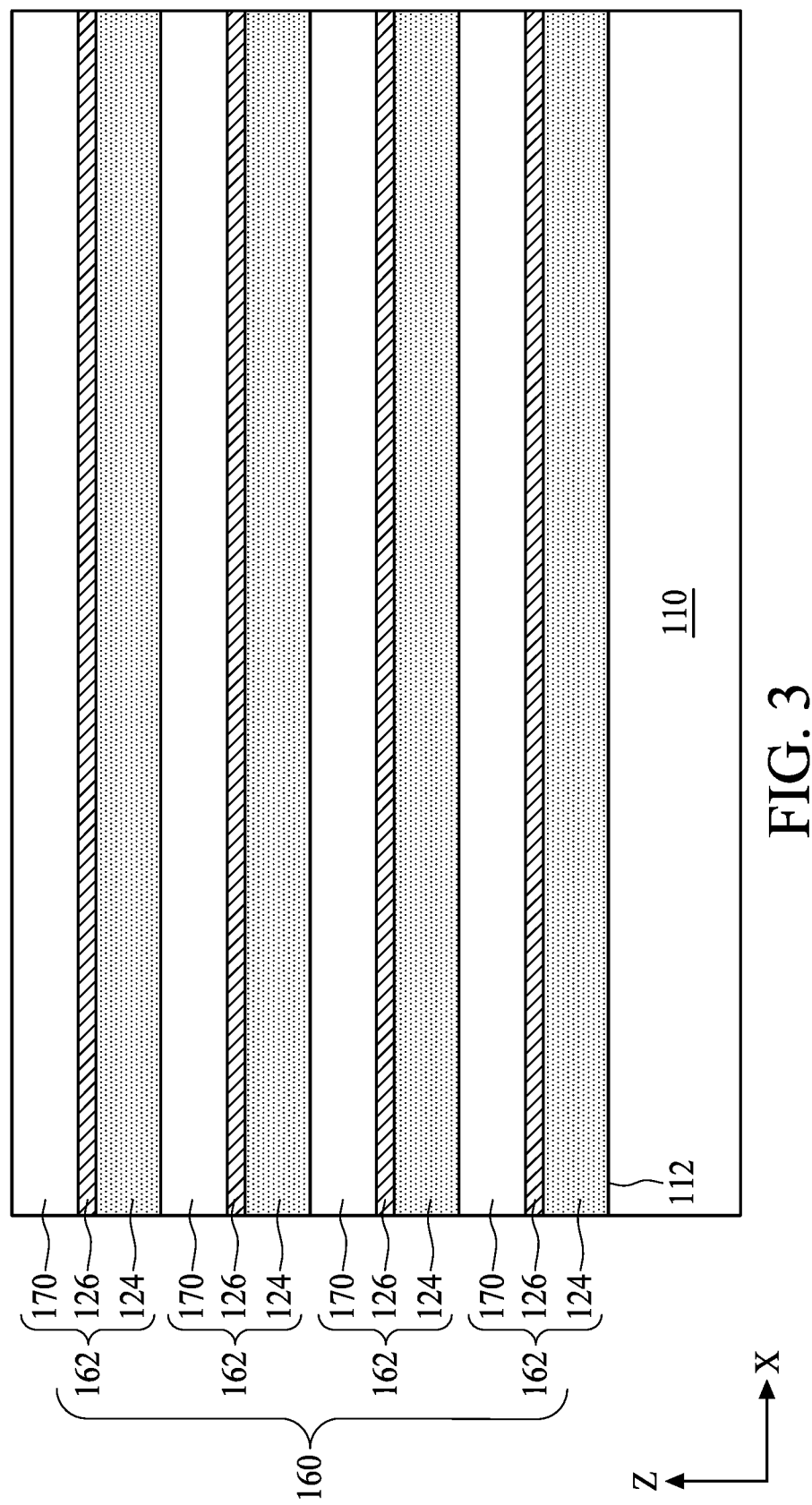
FIG. 3 is a cross-sectional view of an intermediate stage in the manufacturing of a semiconductor structure in accordance with some embodiments of the present disclosure.

Referring to FIG. 3, an initial stack 160 is provided on a substrate 110 according to a step 202 in FIG. 2. In some embodiments, the substrate 110 is a semiconductor substrate, such as a silicon monocrystalline substrate. In some embodiments, the initial stack 160 is formed on a major surface 112 of the substrate 110. In some embodiments, the initial stack 160 includes a plurality of initial sub-stacks 162, wherein each initial sub-stack 162 includes three layers, i.e., an insulating layer 124, a first seed layer 126, and a sacrificial layer 170. In some embodiments, a number of times that the initial sub-stacks 162 are stacked is determined in consideration of the numbers of memory cells of the three-dimensional NAND memory.

In some embodiments, the insulating layer 124, the first seed layer 126, and the sacrificial layer 170 are sequentially stacked over the substrate 110. In some embodiments, the first seed layer 126 is sandwiched between the insulating layer 124 and the sacrificial layer 170. In some embodiments, one of the insulating layers 124 is disposed on the major surface 112, and the other insulating layers 124 are disposed on the sacrificial layers 170. In some embodiments, the insulating layers 124 include silicon dioxide. In some embodiments, the insulating layers 124 are deposited over the substrate 110 by a chemical vapor deposition (CVD) process. In some embodiments, the first seed layer 126 is a metal layer. In some embodiments, the first seed layer 126 includes titanium, copper, tungsten, or a combination thereof. In some embodiments, the first seed layers 126 are deposited on the insulating layers 124 by a CVD process or a physical vapor deposition (PVD) process. In some embodiments, the first seed layer 126 has a thickness less than a thickness of the insulating layer 124 and the sacrificial layer 170. In some embodiments, the sacrificial layers 170 include silicon nitride. In some embodiments, the sacrificial layers 170 are disposed on the first seed layer 126 by a CVD process.

In some embodiments, the insulating layers 124, the first seed layers 126 and the sacrificial layers 170 are formed by an in-situ process. As used herein, the term "in-situ" is used to describe processes that are performed while the substrate 110 for depositing the stack 120 remains within a processing system (e.g., including a load lock chamber, transfer chamber, processing chamber, or any other fluidly coupled chamber), and where, for example, the processing chamber allows the substrate 110 to remain under vacuum conditions. As such, the term "in-situ" may also generally be used to refer to processes in which the substrate 110 being processed is not exposed to an external ambient (e.g., external to the processing system) environment.

Figure 4A:
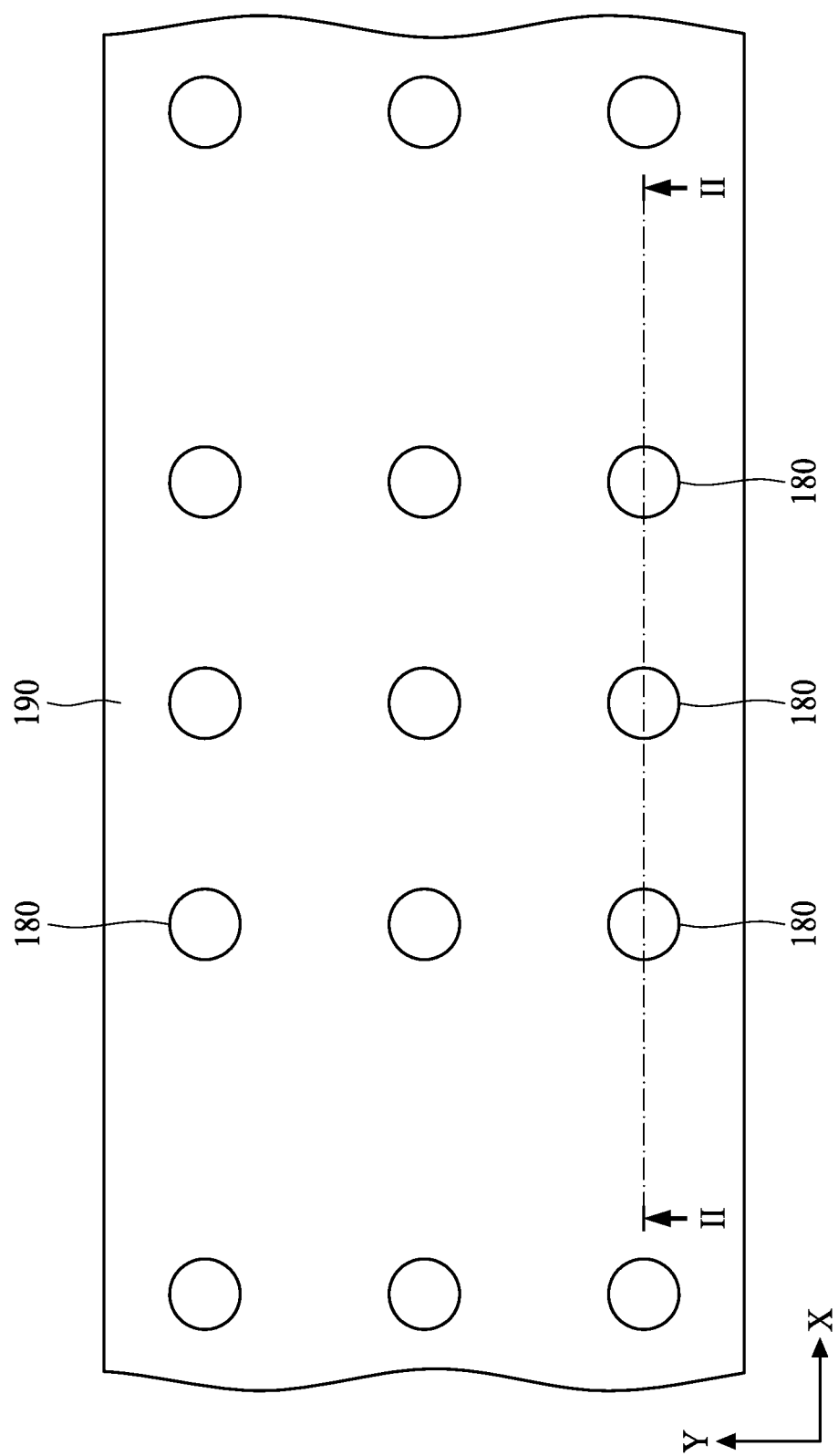
FIG. 4A is a top view of an intermediate stage in the manufacturing of the semiconductor structure in accordance with some embodiments of the present disclosure.
Figure 4B:
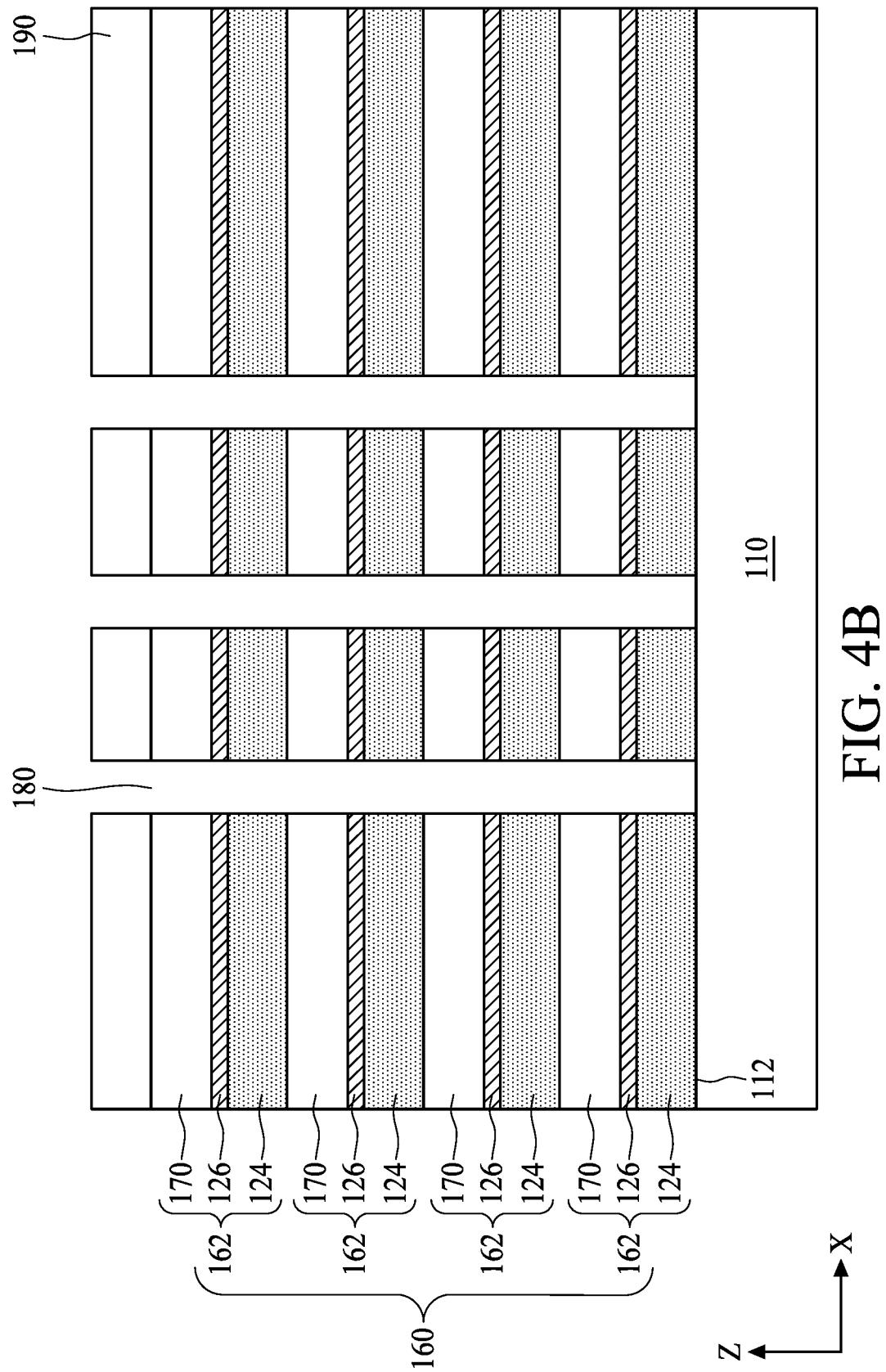
FIG. 4B is a cross-sectional view taken along the line II-II illustrated in FIG. 4A.

Referring to FIGS. 4A and 4B, the initial stack 160 is patterned, in a Z-axis direction, to form a plurality of openings 180 according to a step 204 in FIG. 2. In some embodiments, the openings 180 penetrate through the initial stack 160 so that a portion of the major surface 112 is exposed to the openings 180. In some embodiments, the openings 180 are formed by steps including (1) coating a first photoresist layer 190 on the initial stack 160, (2) performing a photolithography process to define a pattern required to form openings 180 in the first photoresist layer 190, and (3) performing an etching process on the initial stack 160 to produce the openings 180 by using the pattern in the first photoresist layer 190 as a mask. In some embodiments, the openings 180 are formed by a dry etch process, such as a reactive ion etching (RIE) process. In some embodiments, the first photoresist layer 190 is subsequently removed from the initial stack 160 by an ashing process. In some embodiments, the openings 180 are circular.

Figure 5A:
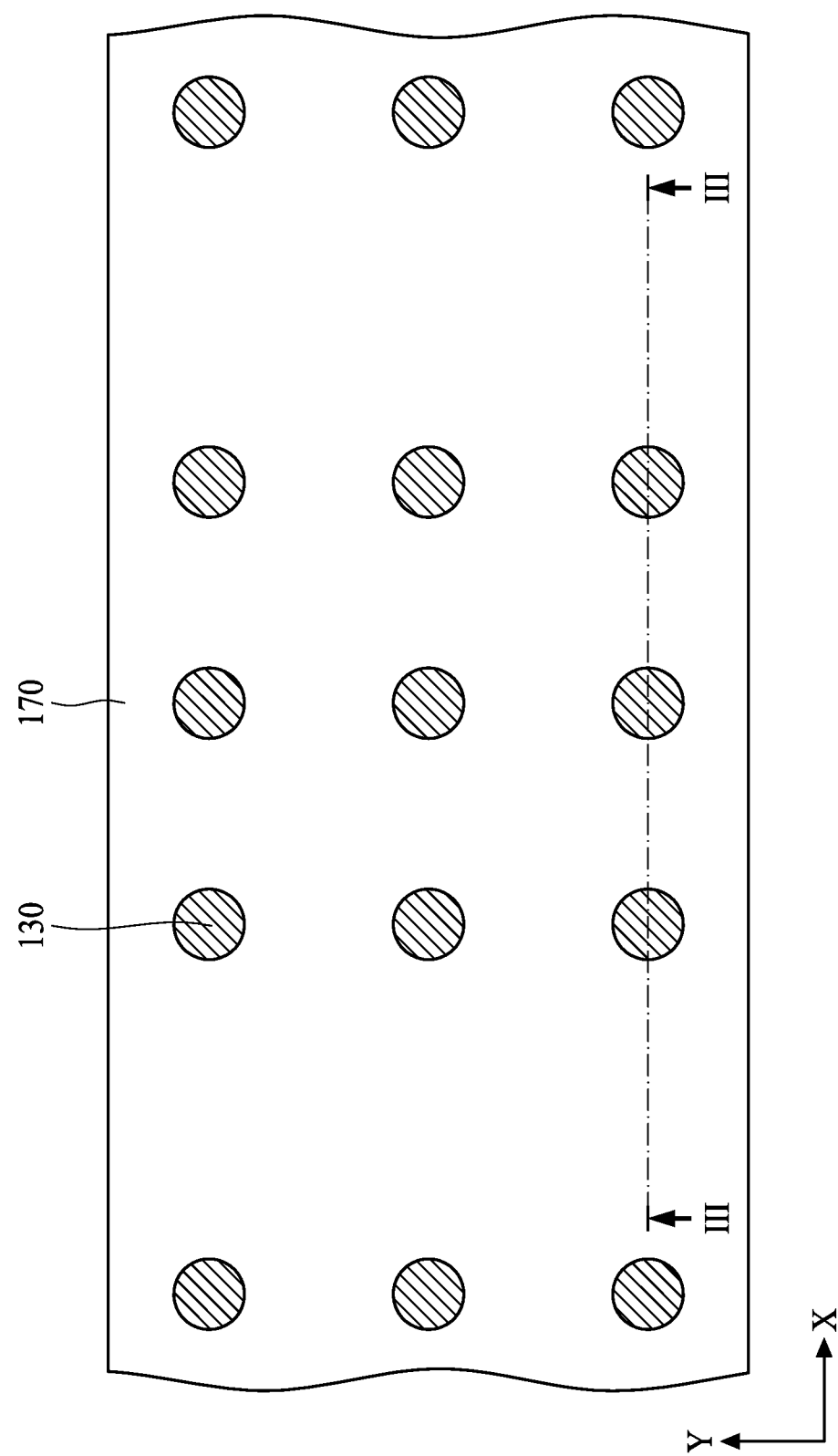
FIG. 5A is a top view of an intermediate stage in the manufacturing of the semiconductor structure in accordance with some embodiments of the present disclosure.
Figure 5B:
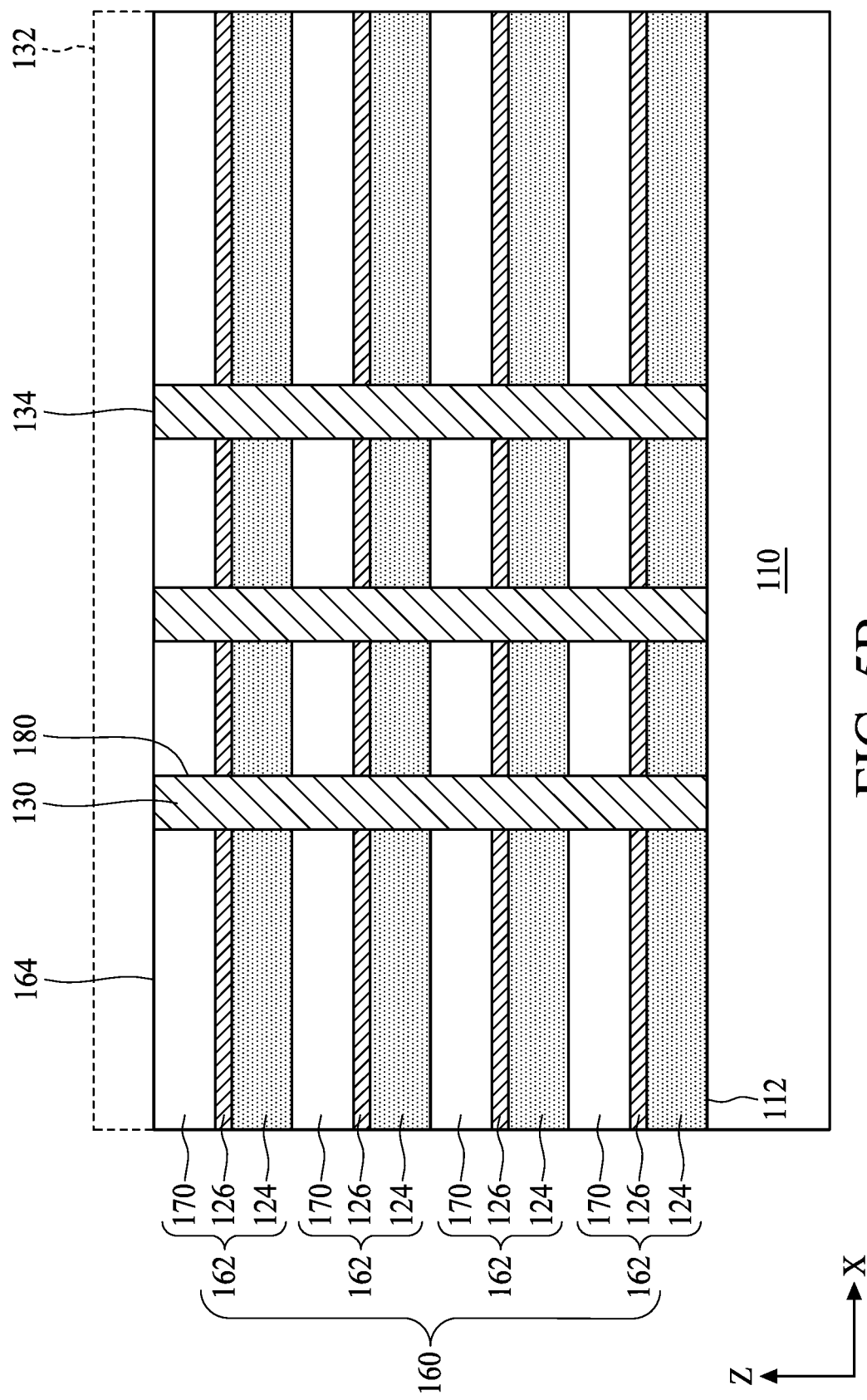
FIG. 5B is a cross-sectional view taken along the line III-III illustrated in FIG. 5A.

Referring to FIGS. 5A and 5B, a plurality of cell pillars 130 are formed in the openings 180 according to a step 206 in FIG. 2. In some embodiments, the cell pillars 130 are formed within the openings 180 by depositing a semiconductor material into the openings 180. In some embodiments, the semiconductor material has a thickness sufficient to fill the openings 180. In some embodiments, the semiconductor material is deposited, for example, by a CVD process. In some embodiments, a planarizing process is optionally performed to remove excess portions 132 of the semiconductor material from above a top surface 164 of the initial stack 160, and the remaining portions of the deposited semiconductor material constitute the cell pillars 130. In some embodiments, an end surface 134 of each of the cell pillars 130 is coplanar with the top surface 164. In some embodiments, the planarizing process is a chemical mechanical planarization (CMP) process. In some embodiments, the cell pillars 130 include polysilicon. In some embodiments, the cell pillars 130 are cylindrical pillars.

Figure 6A:
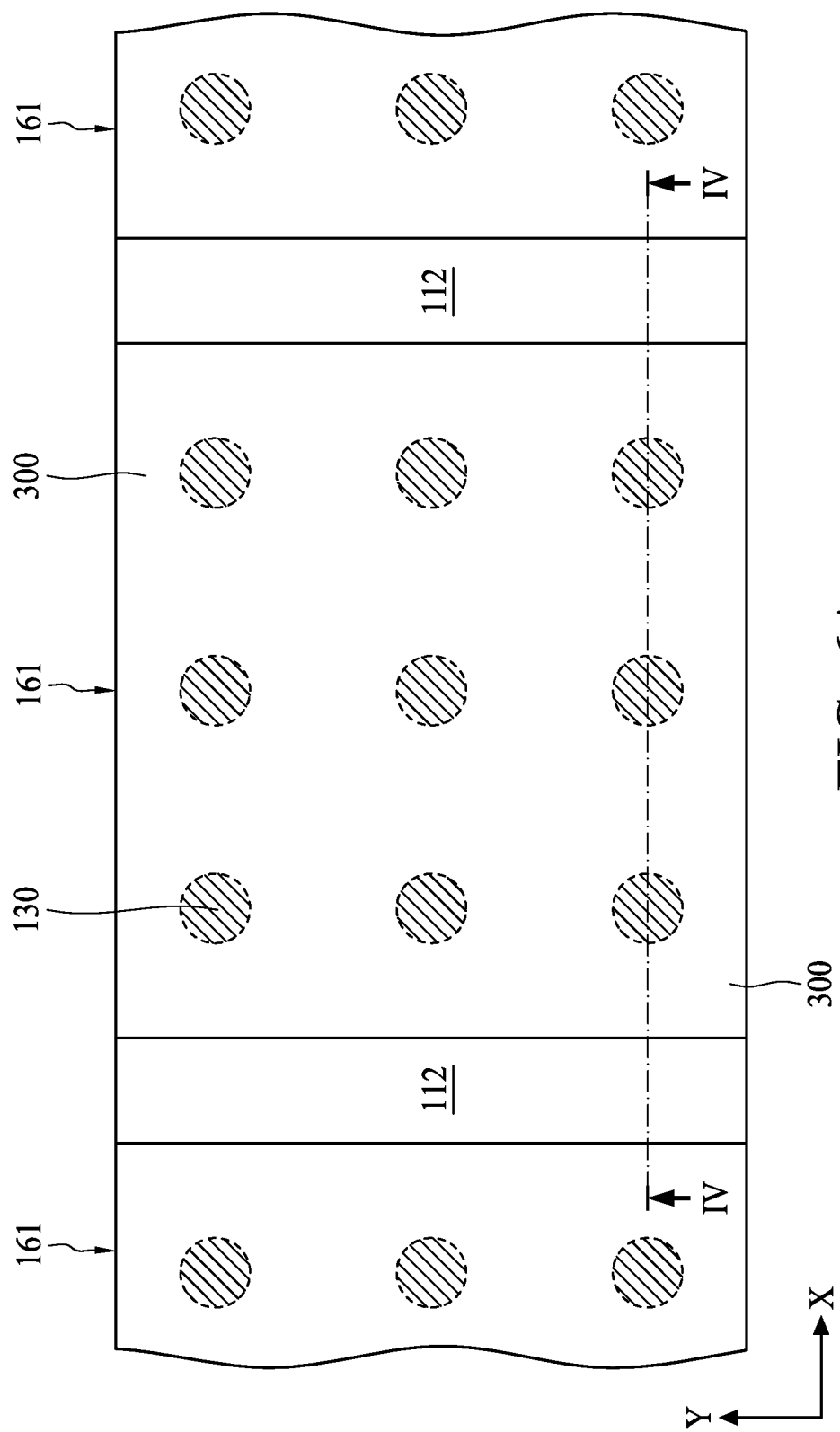
FIG. 6A is a top view of an intermediate stage in the manufacturing of the semiconductor structure in accordance with some embodiments of the present disclosure.
Figure 6B:
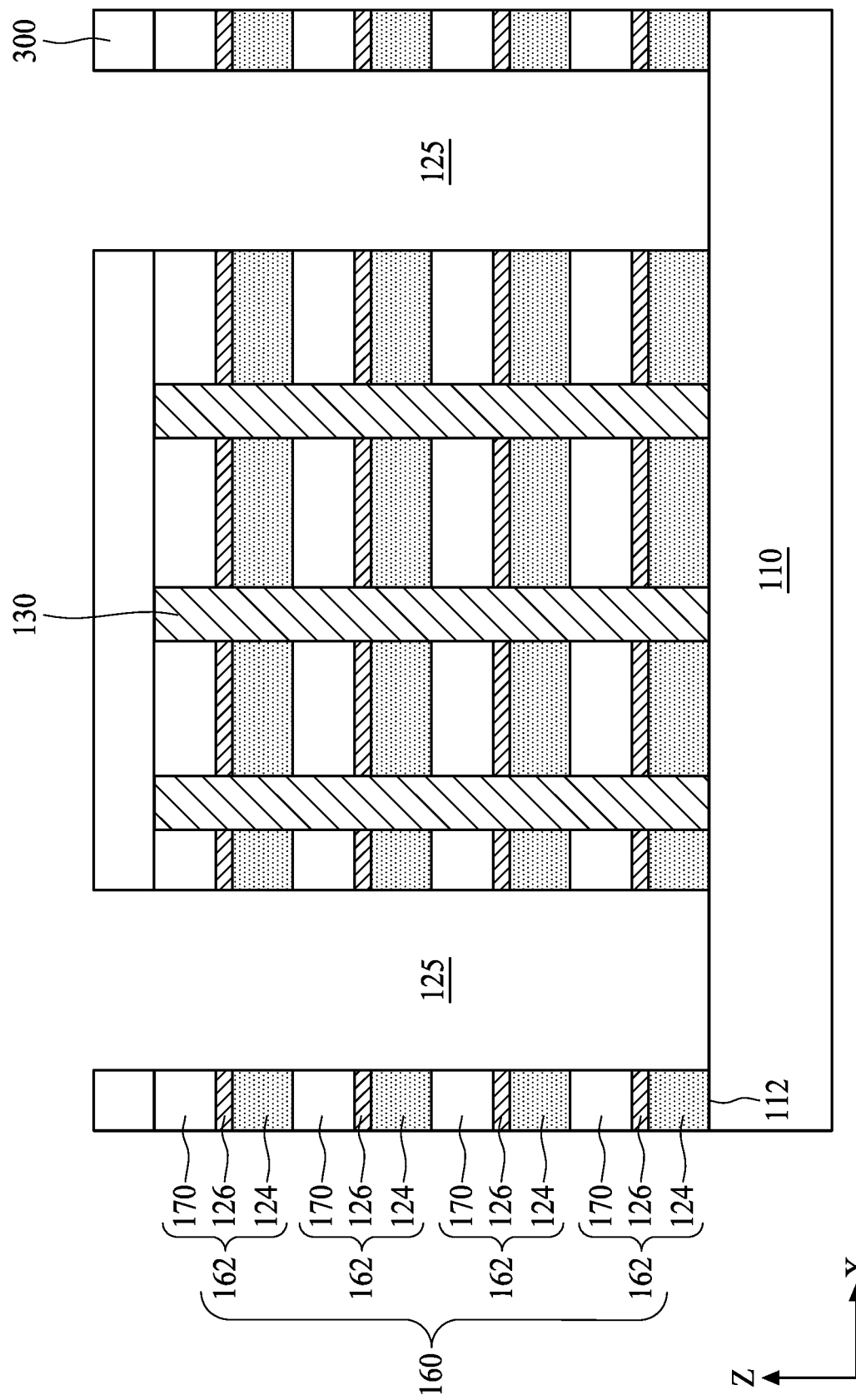
FIG. 6B is a cross-sectional view taken along the line IV-IV illustrated in FIG. 6A.

Referring to FIGS. 6A and 6B, a plurality of slits 125 are formed through the initial stack 160 according to a step 208 in FIG. 2. In some embodiments, the slits 125 extend laterally along a Y direction. In some embodiments, the slits 140 divide the initial stacks 160 into a plurality of portions 161 including multiple core pillars 130. In some embodiments, the slits 125 have a substantially uniform width, and are parallel to one another. In some embodiments, the slits 140 are spaced apart from the cell pillars 130. In some embodiments, the cell pillars 130 are not positioned in the slits 125. In some embodiments, the slits 125 are formed by steps including (1) coating a second photoresist layer 300 on the initial stack 160 and the cell pillars 130, (2) performing a photolithography process to define a pattern required to form slits 125 in the second photoresist layer 300, and (3) performing an etching process on the initial stack 160 to produce the slits 125 using the pattern in the second photoresist layer 300 as a mask. In some embodiments, the cell pillars 130 are not exposed to the pattern in the second photoresist layer 300. In some embodiments, the second photoresist layer 300 is subsequently removed from the initial stack 160 and the cell pillar 130 by an ashing process.

Figure 7A:
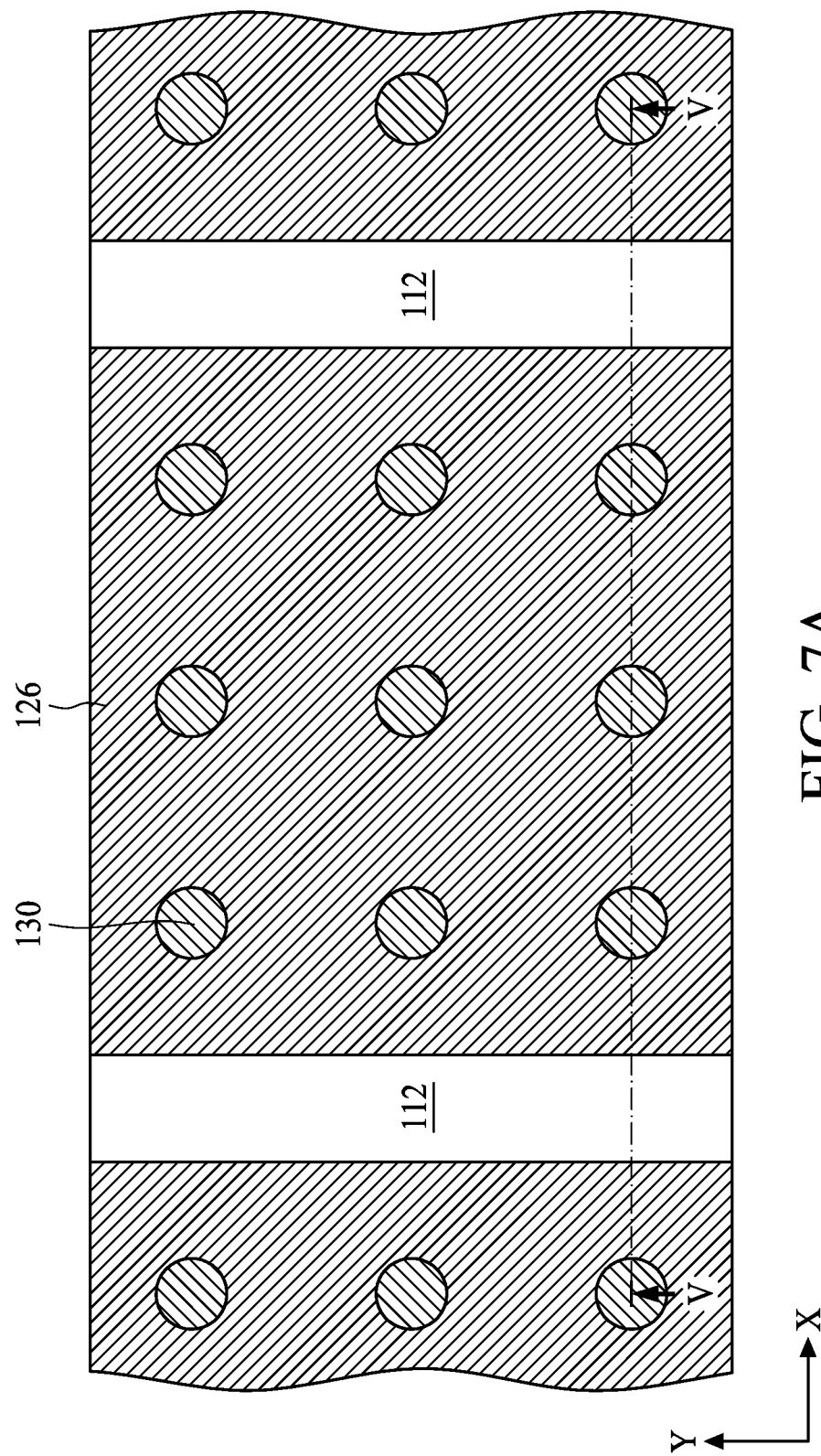
FIG. 7A is a top view of an intermediate stage in the manufacturing of the semiconductor structure in accordance with some embodiments of the present disclosure.
Figure 7B:
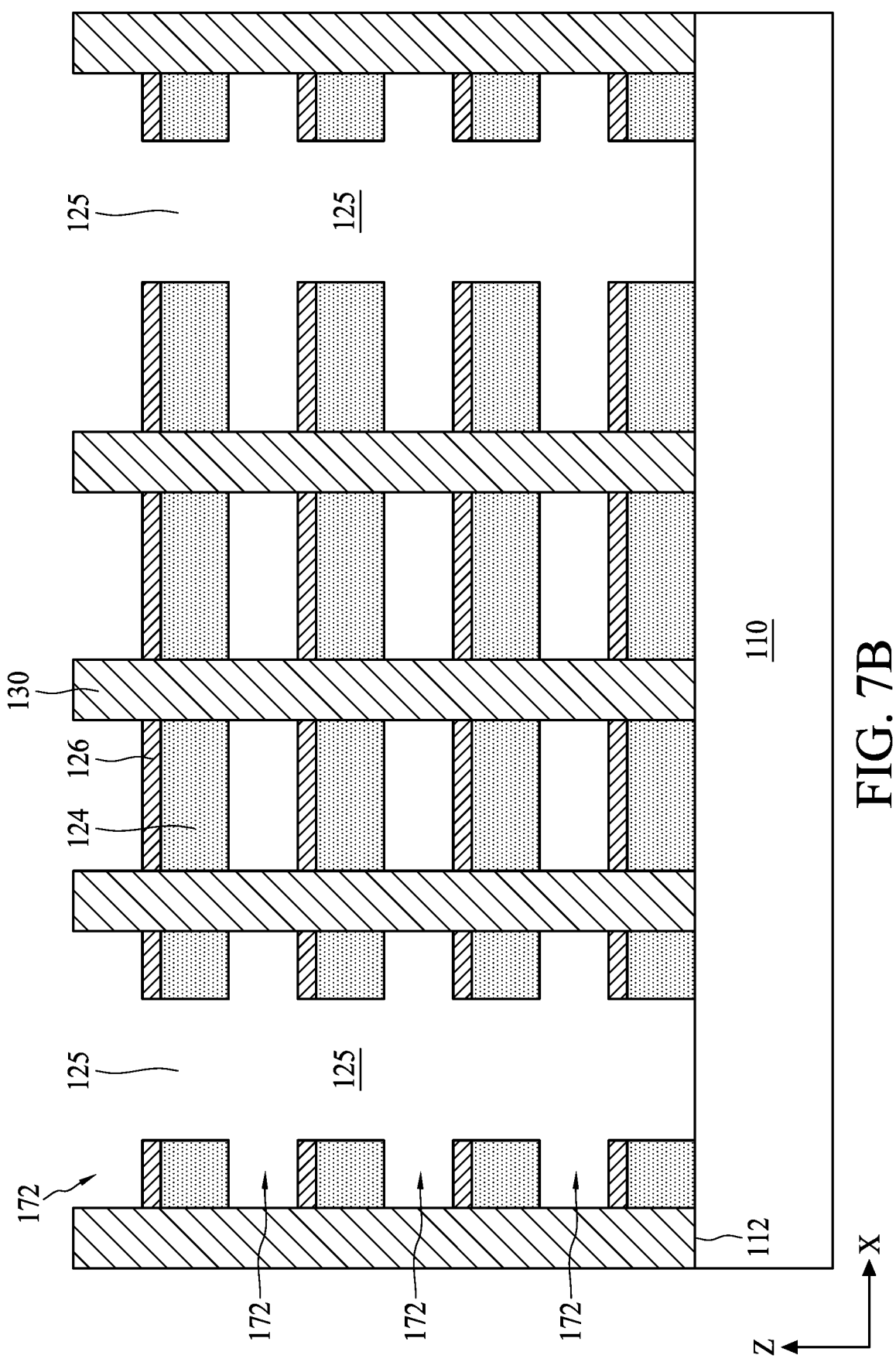
FIG. 7B is a cross-sectional view taken along the line V-V illustrated in FIG. 7A.

Referring to FIGS. 7A and 7B, in some embodiments, the sacrificial layers 170 are removed from the slits 150 according to a step 210 in FIG. 2. In some embodiments, the sacrificial layers 170 are removed, while the insulating layers 124 and the first seed layers 126 are held in place by the cell pillars 130. In some embodiments, a plurality of lateral recess regions 172 are formed at each level of the sacrificial layers 170 through the slits 140. In some embodiments, the lateral recess regions 172 are formed, for example, by a selective etching process in which the sacrificial layers 170 are etched according to the insulating layers 124 and the first seed layers 126. In some embodiments, the etching process etches the sacrificial layers 170 at higher rate than the insulating layers 124 and the first seed layers 126. In some embodiments, a hot phosphoric acid ($H_3PO_4$) wet etching process is used to remove the sacrificial layers 170 without etching the insulating layers 124 or the first seed layers 126. In some embodiments, the selective removal of the sacrificial layers 170 is accomplished by a wet etching process. In some embodiments, the first seed layers 126 are exposed to the lateral recess regions 172, thereby facilitating subsequent electrodeposition. In some embodiments, the lateral recess regions 172 communicate with the slits 125.

Figure 8:
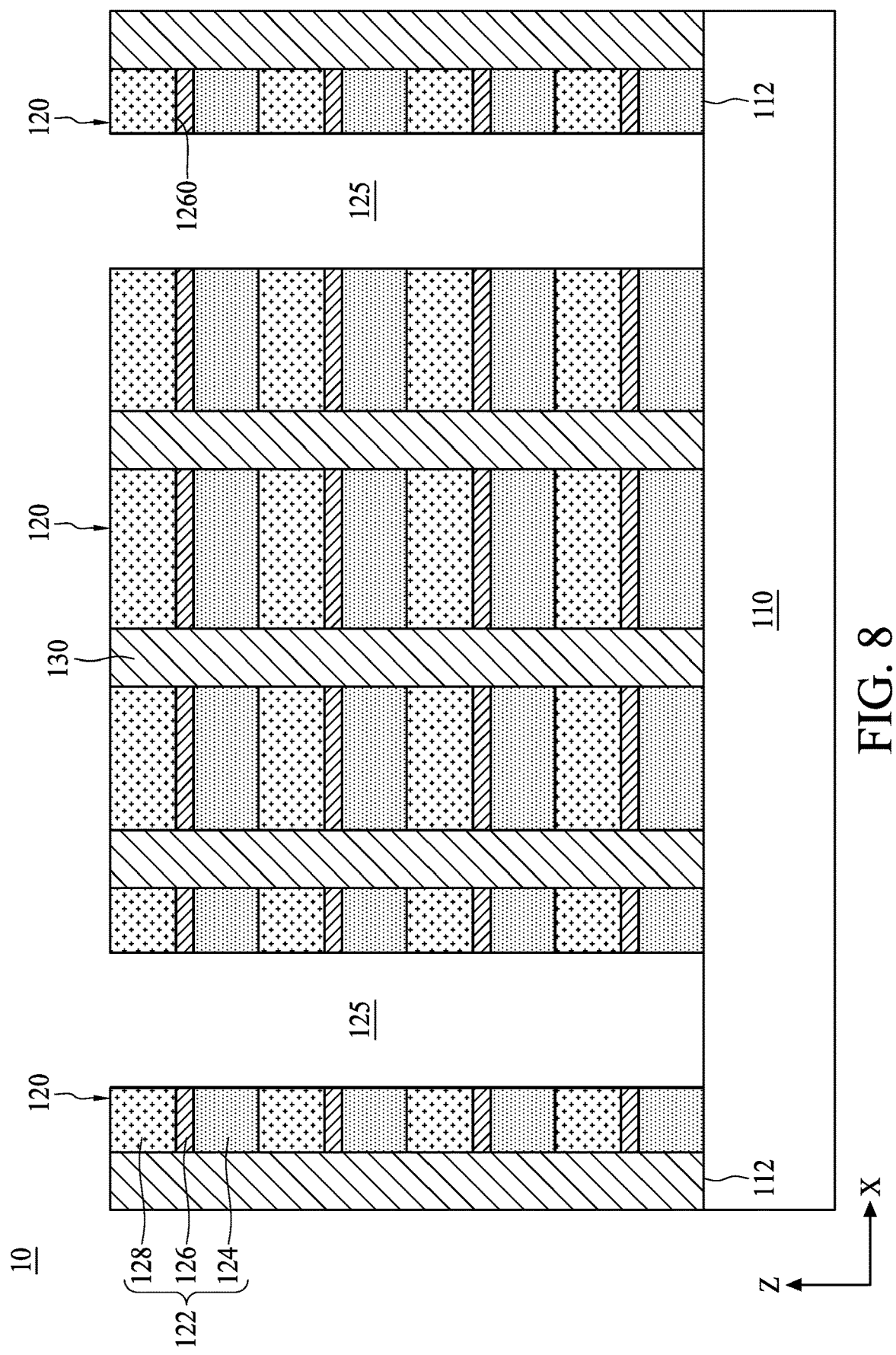
FIGS. 8 through 10 are cross-sectional views of intermediate stages in the manufacturing of the semiconductor structure in accordance with some embodiments of the present disclosure

Referring to FIG. 8, in some embodiments, a conductive material is deposited on the first seed layers 126 to form the metal layers 128 according to a step 212 in FIG. 2. Accordingly, the semiconductor structure 10 is formed. In some embodiments, the metal layers 128 are formed within the lateral recess regions 172 from which the sacrificial layers 170 were previously etched. That is, the sacrificial layers 170 are replaced by the metal layer 128. In some embodiments, the metal layers 128 are formed in the lateral recess regions 172 by an electrodepositing process. In some embodiments, the conductive material is deposited on the first seed layer 126 exposed to the lateral recess regions 172. In some embodiments, the conductive material includes copper or tungsten. In some embodiments, each of the first seed layers 126 is used as the electrodepositing electrode for providing a transverse current path needed in the electrodepositing process. Hence, the electrodepositing current can be directed to the lateral recess regions 172 where the first seed layers 126 are exposed, which results in the deposition of the metal layers 128 on upper surfaces 1260, far away from the insulating layers 124, of the first seed layer 126.

Figure 9:
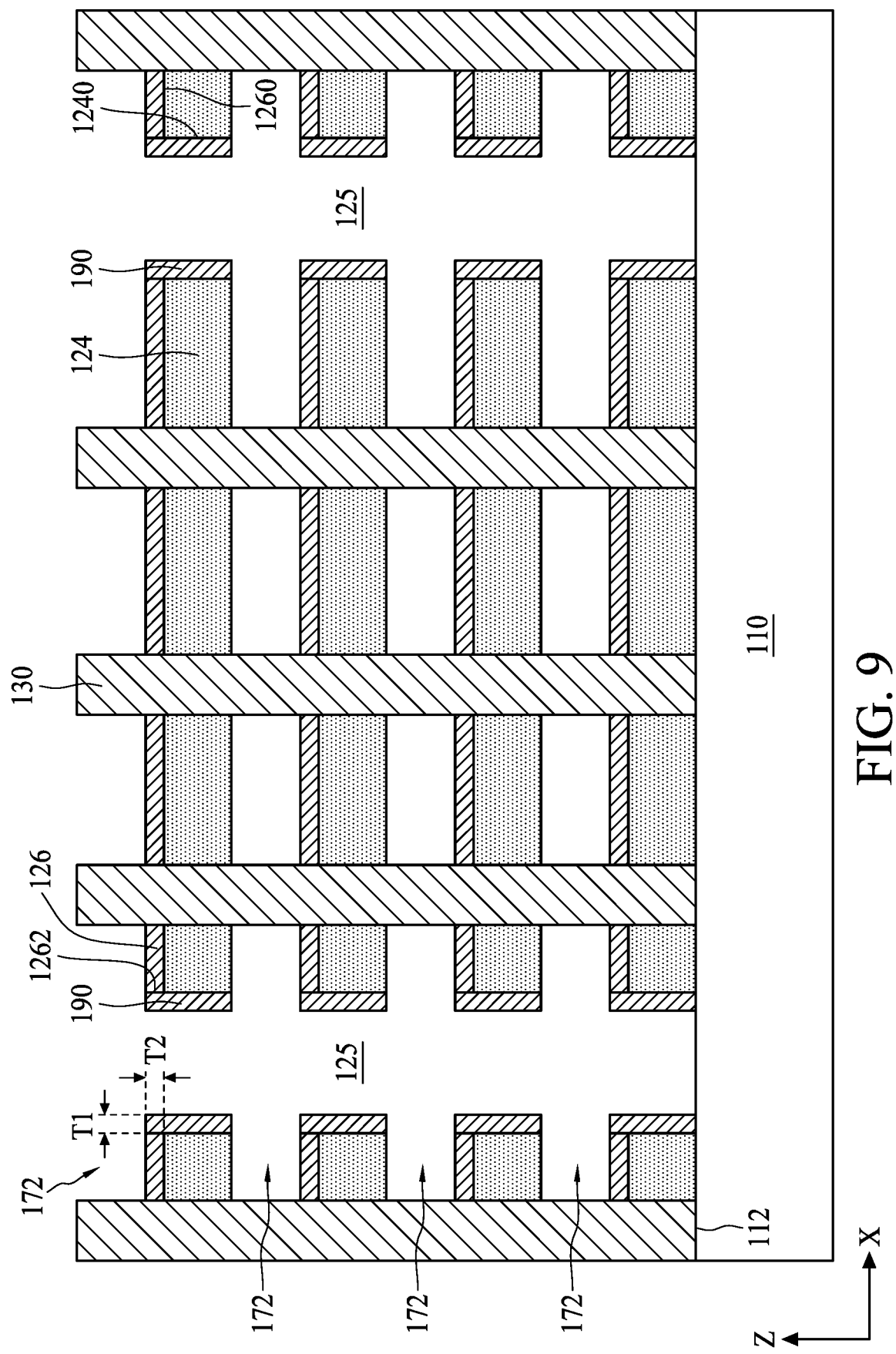

It should be noted that, in some embodiments, after the removal of the sacrificial layers 170, a second seed layer 190 (as shown in FIG. 9) can be provided on sidewalls 1240 of the insulating layers 124 according to a step 211 in FIG. 2. In some embodiments, the second seed layer 190 is further disposed on sidewalls 1262 of the first seed layer 126. In some embodiments, the second seed layer 190 is connected to the first seed layer 126 disposed on the same insulating layer 124. In some embodiments, a material of the first seed layer 126 and a material of the second seed layer 190 are consistent. In some embodiments, a thickness T1 of the first seed layer 126 on the upper surface 1260 is substantially the same as a thickness T2 of the second seed layer 190 on the sidewall 1240. In some embodiments, the second seed layers 190 are formed by a CVD process.

Figure 10:
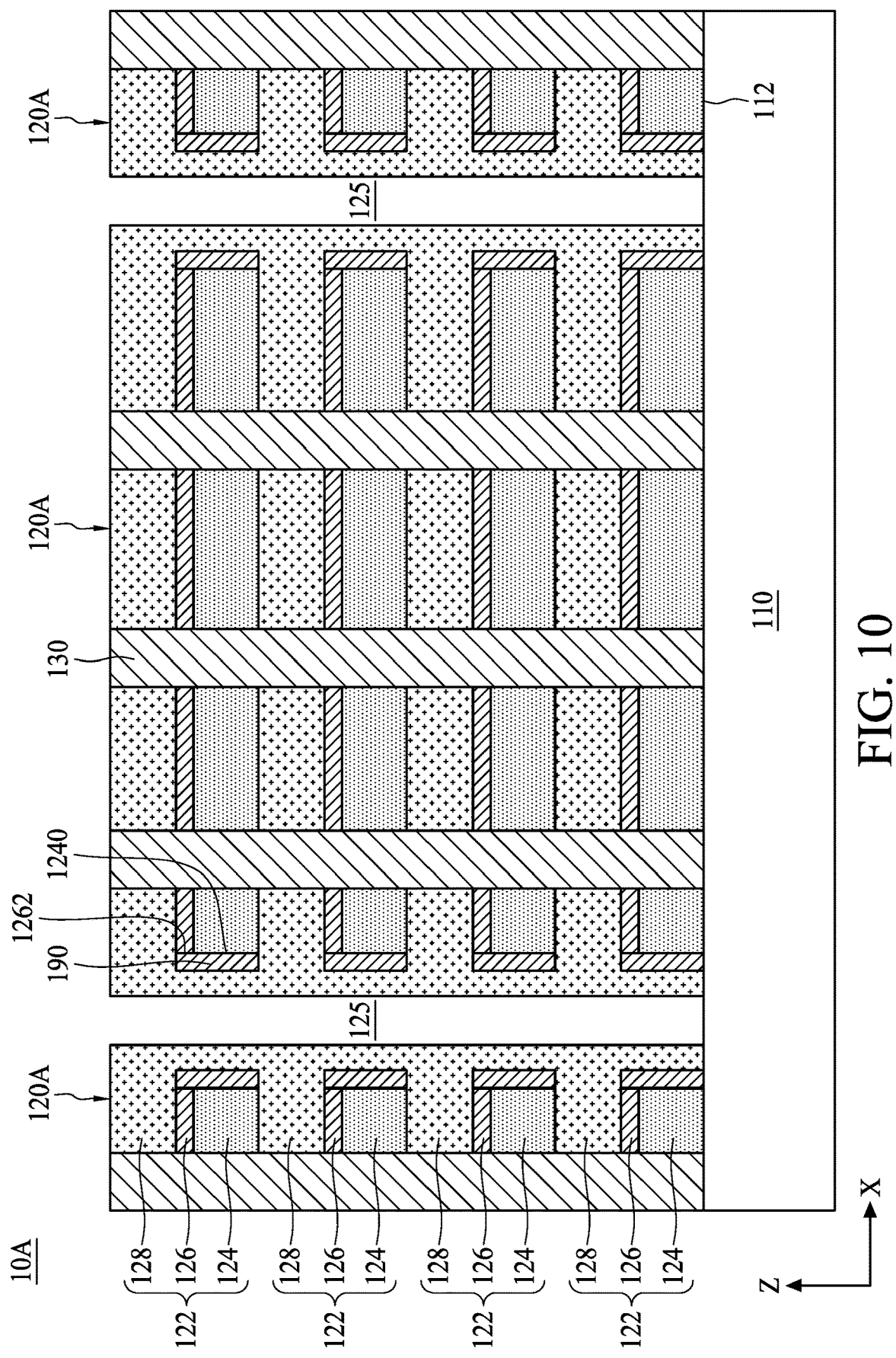

After the deposition of the second seed layer 190, the conductive material is deposited on the first seed layers 126 and the second seed layers 190 according to a step 212 in FIG. 2. Accordingly, a semiconductor structure 10A is formed as shown in FIG. 10. In some embodiments, the metal layers 128 are formed within the lateral recess regions 172 from which the sacrificial layers 170 were previously etched. In some embodiments, the metal layers 128 are formed in the lateral recess regions 172 by an electrodepositing process. In some embodiments, the conductive material is deposited on the first seed layers 126 and the second seed layer 190. In some embodiments, the conductive material includes copper or tungsten. In some embodiments, each of the first seed layers 126 and the second seed layer 190 is used as the electrodepositing electrode for providing a current path needed in the electrodepositing process. Hence, the electrodepositing current can be directed to positions where the first seed layers 126 and the second seed layer 190 are disposed, which results in the effective deposition of the metal layers 128 on the first seed layer 126 and the second seed layer 190.

In FIG. 10, in some embodiments, the semiconductor structure 10A includes a substrate 110, a plurality of stacks 120A including a plurality of sub-stacks 122 being disposed on the substrate 110 and separated from each other by at least one slit 140, and a plurality of cell pillars 130 penetrating through the stack 120A. In some embodiments, the sub-stacks 122 include an insulating layer 124, a first seed layer 126 and a metal layer 128, wherein the first seed layer 126 is sandwiched between the insulating layer 124 and the metal layer 128. The stack 120A further includes a plurality of second seed layers 190 disposed on sidewalls 1240 of the insulating layers 124 and sidewalls 1262 of the first seed layers 126. In some embodiments, the insulating layer 124 includes silicon dioxide. In some embodiments, the first seed layer 126 and the second seed layer 190 are metal layers. In some embodiments, the first seed layer 126 and the second seed layer 190 include titanium or copper.

In conclusion, with the configuration of the semiconductor structure 10/10A, the first seed layer 126 disposed on the insulating layer 124 and exposed to the lateral recess regions 172 after removal of the sacrificial layers 170 is used as the electrodepositing electrode for providing the transverse current path needed in the electrodepositing process for depositing the meal layers 128. Hence, the electrodepositing current can be directed to positions where the first seed layers exist, which results in effective lateral deposition of the metal layers 128.

One aspect of the present disclosure provides a semiconductor structure. The semiconductor structure includes a substrate, a plurality of stacks, and a plurality of cell pillars. The stacks are disposed on the substrate and are separated from each other by at least one slit. Each of the stacks includes a plurality of sub-stacks, and each of the sub-stacks has an insulating layer, a first seed layer, and a metal layer being sequentially stacked. The cell pillars penetrate through each of the stacks.

One aspect of the present disclosure provides a method for manufacturing a semiconductor structure. The method includes steps of depositing an initial stack comprising a plurality of initial sub-stacks on a substrate, wherein each of the plurality of initial sub-stacks includes an insulating layer, a sacrificial layer, and a seed layer, wherein the seed layer is sandwiched between the insulating layer and the sacrificial layer; forming a plurality of cell pillars penetrating through the initial stack; forming at least one slit in the initial stack to divide the initial stack into a plurality of portions; removing the sacrificial layers from the slits to form a plurality of lateral recess regions; and depositing a conductive material in the lateral recess regions.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
   a substrate;
   a plurality of stacks disposed on the substrate and separated from each other by at least one slit, wherein each of the plurality of stacks comprises a plurality of sub-stacks, and each of the plurality of sub-stacks includes an insulating layer, a first seed layer, and a metal layer being sequentially stacked; and
   a plurality of cell pillars penetrating through each of the plurality of stacks;
   wherein each of the plurality of stacks further comprises a plurality of second seed layers disposed on sidewalls of the insulating layers and covered by the metal layers.

2. The semiconductor structure of claim 1, wherein the cell pillars are spaced apart from the slit.

3. The semiconductor structure of claim 1, wherein the second seed layers are connected to the first seed layers disposed on the same insulating layers.

4. The semiconductor structure of claim 1, wherein a height of the first seed layer is substantially the same as a thickness of the second seed layer.

5. The semiconductor structure of claim 1, wherein a material of the first seed layer and a material of the second seed layer are consistent.

6. The semiconductor structure of claim 1, wherein the cell pillars are connected to the substrate.

7. The semiconductor structure of claim 1, wherein the stacks are separated by a plurality of slits having a substantially uniform width, and the slits are parallel to one another.

* * * * *